US012750952B2

(12) United States Patent
Souriau et al.

(10) Patent No.: US 12,750,952 B2
(45) Date of Patent: Sep. 29, 2026

(54) INTERCONNEXION FILM AND ELECTRONIC STRUCTURE COMPRISING SUCH A FILM

(71) Applicant: COMMISSARIAT À L'ENERGIE ATOMIQUE ET AUX ENERGIES ALTERNATIVES, Paris (FR)

(72) Inventors: Jean-Charles Souriau, Grenoble Cedex (FR); Julia De Girolamo, Grenoble Cedex (FR); Auriane Despax-Ferreres, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 173 days.

(21) Appl. No.: 18/768,764

(22) Filed: Jul. 10, 2024

(65) Prior Publication Data

US 2025/0024600 A1 Jan. 16, 2025

(30) Foreign Application Priority Data

Jul. 10, 2023 (FR) ........................................ 2307378

(51) Int. Cl.
*H05K 1/11* (2006.01)
*H01B 13/00* (2006.01)
*H05K 1/181* (2026.01)

(52) U.S. Cl.
CPC ......... *H05K 1/111* (2013.01); *H01B 13/0036* (2013.01); *H05K 1/181* (2013.01); *H05K 2201/10954* (2013.01)

(58) Field of Classification Search
CPC ................... H05K 1/111; H05K 1/181; H05K 2201/10954; H01B 13/0036
(Continued)

(56) References Cited

U.S. PATENT DOCUMENTS 7,476,982 B2 1/2009 Autumn et al.
2006/0097373 A1 5/2006 Ito
(Continued)

FOREIGN PATENT DOCUMENTS

EP 3 364 456 A2 8/2018
FR 3 084 556 B1 11/2020
(Continued)

OTHER PUBLICATIONS

Search Report as issued in French Patent Application No. FR2307378, dated Feb. 2, 2024.
(Continued)

*Primary Examiner* — Binh B Tran
(74) *Attorney, Agent, or Firm* — CUSHMAN PARTNERS, LLC

(57) ABSTRACT

An interconnexion film includes a base layer made of an insulating polymeric material and including a first face and a second face; a plurality of first patterns projecting from the first face, formed of the insulating polymeric material and configured so that the interconnexion film constitutes a dry adhesive film; a metal element of solid metal including a body which extends through the base layer; and as an extension of the body, at least one second pattern projecting from the first face, having a different shape to the first patterns and, in a plane parallel to the first face, a constant or decreasing cross-section away from the first face.

12 Claims, 6 Drawing Sheets

(58) Field of Classification Search
USPC .......................................................... 361/767
See application file for complete search history.

(56) References Cited

U.S. PATENT DOCUMENTS

| | | | | |
|---|---|---|---|---|
| 2011/0016675 | A1* | 1/2011 | Mayers | A44B 18/0049 24/450 |
| 2023/0178412 | A1* | 6/2023 | Oowada | C09J 179/08 438/458 |

FOREIGN PATENT DOCUMENTS

| | | | |
|---|---|---|---|
| FR | 3 126 259 | A1 | 2/2023 |
| KR | 10-2018-0049765 | A | 5/2018 |
| WO | WO 2019/042565 | A1 | 3/2019 |

OTHER PUBLICATIONS

Kim, T., et al., "Bioinspired, Highly Stretchable, and Conductive Dry Adhesives Based on 1D-2D Hybrid Carbon Nanocomposites for All-in-One ECG Electrodes," Acs Nano, (Year: 2016), pp. 4770-4778.

* cited by examiner

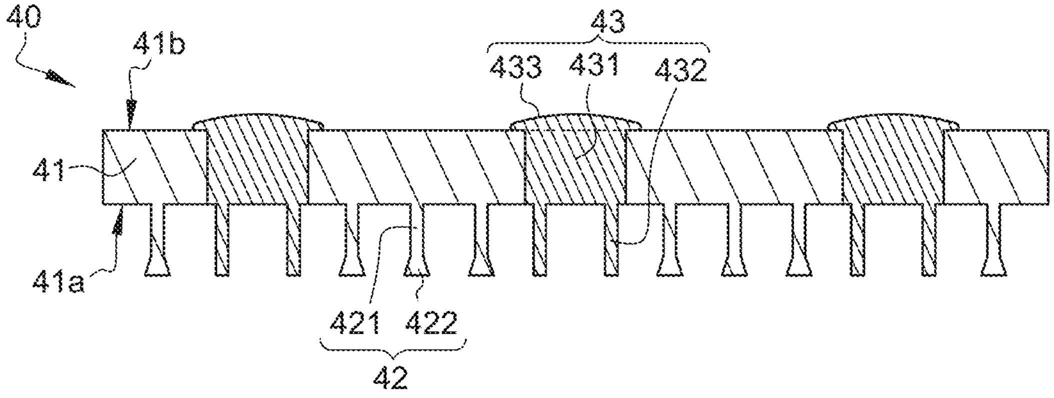
Fig. 4
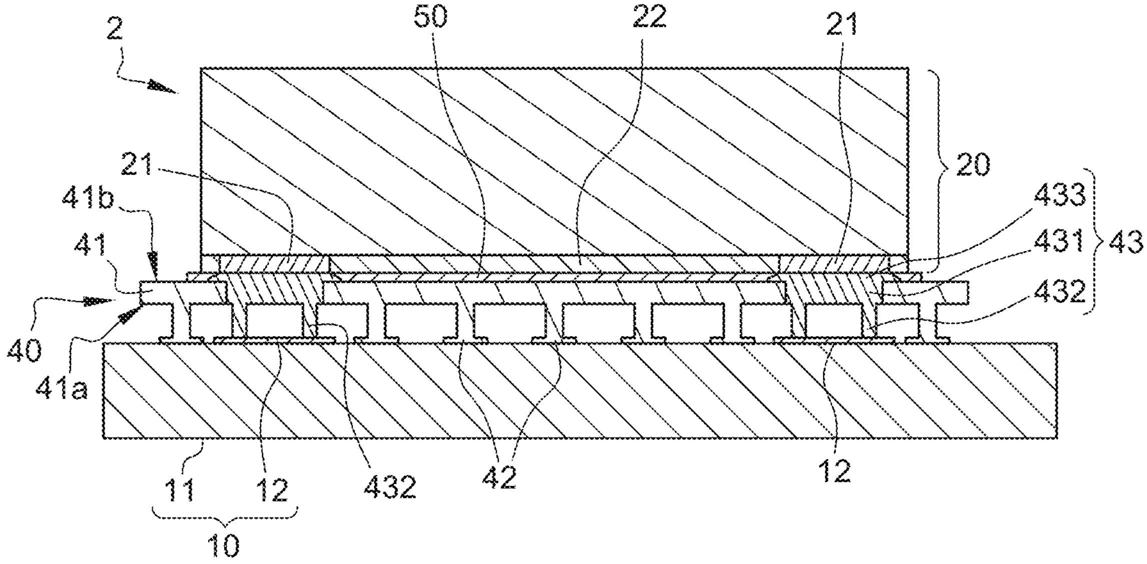
Fig. 5
Fig. 6
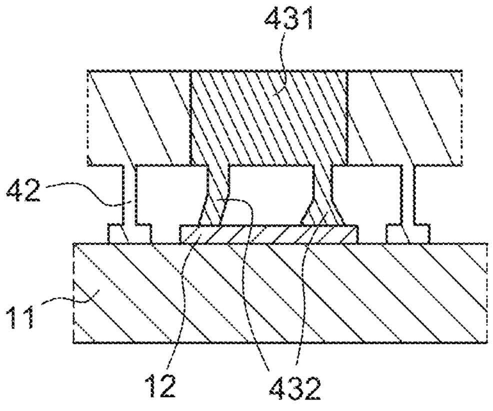

INTERCONNEXION FILM AND ELECTRONIC STRUCTURE COMPRISING SUCH A FILM

CROSS-REFERENCE TO RELATED APPLICATIONS

This application claims priority to French Patent Application No. 2307378, filed Jul. 10, 2023, the entire content of which is incorporated herein by reference in its entirety.

FIELD

The technical field of the invention is that of films for electrically and mechanically interconnecting two objects, for example an electronic component and a flexible substrate capable of deforming and adapting to a non-planar surface such as skin. The present invention more particularly relates to an interconnexion film comprising patterns configured to form a dry adhesive film. The present invention also relates to an electronic structure comprising a substrate, an electronic component and the interconnexion film disposed between the substrate and the electronic component.

BACKGROUND

Flexible electronic structures can incorporate electronic components such as integrated circuits, sensors, actuators, batteries, passive components, radio frequency identification (RFID) chips and antennas. The manufacture of a flexible electronic structure comprises the transfer of one or more electronic components onto a flexible substrate, also known as a flexible printed circuit. This substrate comprises a support film, for example made of polyester, polyimide, polytetrafluoroethylene or polyetheretherketone, and metal tracks disposed on the surface of the support film. Each electronic component comprises connection pads which end on a face of the component, this face being commonly referred to as the "active face".

A first interconnexion technique (called "wire bonding") consists in electrically connecting the connection pads of the component to the metal tracks of the substrate with wires, when the active face of the component is pointing upwards.

When, on the other hand, the active face of the component is pointing downwards (in other words when it is disposed facing the substrate), the connection pads of the component can be connected to the metal tracks of the substrate by soldering, using a fusible material, a conductive adhesive or a conductive element pressed onto each interconnexion pad. This second interconnexion technique, both electrical and mechanical, is commonly referred to as "flip-chip", in reference to the flipped position of the component. Interconnexion elements, such as fusible microbeads, anisotropic conductive film or gold stud bumps, can be disposed between the component and the substrate.

As electronic components are often thick and rigid, bending stresses in the electronic structure put a lot of strain on the bonding, welding or soldering interfaces, which eventually fail.

To overcome this problem, it has been suggested placing the interfaces or interconnexion elements as close as possible to the neutral plane of the electronic structure.

For example, document US2006/097373A1 describes an electronic structure comprising a flexible substrate and an electronic component bonded to the substrate by means of a layer of thermosetting resin, typically an epoxy resin. A conductive pillar electrically connects a connection pad arranged in the active face of the component and a metal track disposed on the flexible substrate. This conductive pillar extends through the thermosetting resin layer. The electronic structure further comprises a so-called passivation insulating layer, the thickness of which is chosen to bring the neutral plane of the structure at the active face of the component.

This arrangement makes it possible to limit mechanical bending stresses at the electrical connection of the component (in other words when the electronic structure is folded). However, it is not completely satisfactory when the electronic structure is subjected to tensile stress (stretching) or shear stress.

FIG. 1 represents an electronic structure 1 described in patent application FR3126259A1. The electronic structure 1 comprises a substrate 10, an electronic component 20 and an interconnexion film 30 disposed between the substrate 10 and the electronic component 20. The interconnexion film 30 electrically and mechanically connects the electronic component 20 to the substrate 10. This electronic structure 1 is designed to have a long service life, especially by virtue of better resistance to tensile (stretching) and/or shear stresses.

The interconnexion film 30 comprises a first face **30*a*, a second face 30*b* opposite to the first face, an electrically conductive zone 31 extending from the first face 30*a* to the second face 30*b* and an electrically insulating polymeric material 32 embedding the electrically conductive zone 31. At least one of the first and second faces 30*a*-30*b* of the interconnexion film 30 is structured to form a dry adhesive film, by having a plurality of projecting patterns 33. The patterns 33 are mushroom-shaped, for example. Part of the patterns 33 are formed of the polymeric material 32 and the other part of the patterns 33 belong to the electrically conductive zone 31**.

The electrically conductive zone 31 comprises an electrically conductive material, preferably chosen from carbon nanowires, carbon nanotubes, carbon black, metal particles or graphene. This electrically conductive material may be used alone or in a mixture with a polymeric material, identical to or different from the polymeric material forming the base of the interconnexion film.

The method for manufacturing the interconnexion film 30 comprises forming a mould comprising cavities, for example mushroom-shaped cavities, depositing a conductive material (for example carbon nanotubes) in a region of the mould to form the electrically conductive zone 31, embedding the electrically conductive zone 31 with the polymeric material 32 and unmoulding the interconnexion film 30 thus obtained.

SUMMARY

The purpose of the invention is to improve performance of the interconnexion film of prior art without making it more difficult to manufacture.

According to a first aspect of the invention, this objective is approached by providing an interconnexion film comprising:

- a base layer formed of an electrically insulating polymeric material and comprising a first face and a second face opposite to the first face;
- a plurality of first patterns projecting from the first face, the first patterns being formed of the electrically insulating polymeric material and configured so that the interconnexion film constitutes a dry adhesive film;

a metal element comprising:
  a body which extends through the base layer from the first face to the second face; and
  as an extension of the body, at least one second pattern projecting from the first face.

The interconnexion film is remarkable in that the metal element is made of solid metal and in that said at least one second pattern of the metal element has a shape different from that of the first patterns and, in a plane parallel to the first face, a constant or decreasing cross-section away from the first face.

Thus, the metal element has a higher electrical conductivity and rigidity than the electrically conductive zone of the interconnexion film according to prior art. The shape of the second pattern of the metal element, which is different from that of the first patterns, makes it possible to continue using a mould to manufacture the interconnexion film. There is no risk of the second pattern of the metal element breaking during unmoulding and becoming trapped in the mould. The interconnexion film can therefore be manufactured easily and in large volume.

In an embodiment, each first pattern comprises a pillar extending from the first face of the base layer and a cap located at one end of the pillar, the cap having, in a plane parallel to the first face, dimensions greater than those of the pillar.

Beneficially, the metal element further comprises, as an extension of the body, a head which rests on the second face of the base layer.

Said at least one second pattern of the metal element may have a height greater than or equal to that of the first patterns.

A second aspect of the invention relates to an electronic structure comprising:
a substrate;
an electronic component;
an interconnexion film according to the first aspect of the invention, disposed between the substrate and the electronic component so as to electrically and mechanically connect the electronic component to the substrate.

In an embodiment, the substrate comprises an electrically conductive pad, the electronic component comprises a connection pad, and the metal element of the interconnexion film connects the electrically conductive pad to the connection pad.

In an embodiment, the first face of the base layer is disposed facing the substrate, the first patterns are in contact with the substrate and the second face of the base layer is disposed facing the electronic component.

According to a development of this embodiment, the second face of the base layer is separated from the electronic component by a layer of adhesive.

A third aspect of the invention relates to a method for manufacturing an interconnexion film, comprising the following steps of:
providing a mould comprising first cavities and a second cavity, the first cavities and the second cavity extending from an external face of the mould, the second cavity having a shape different from that of the first cavities and, in a plane parallel to the external face, a constant or decreasing cross-section away from the external face;
forming a metal element in a region of the mould comprising the second cavity, the metal element comprising a body disposed on the external face of the mould and, as an extension of the body, a projecting pattern disposed within the second cavity;
depositing an electrically insulating polymeric material in the first cavities and on the external face of the mould, so as to form a polymer film which embed the body of the metal element; and
unmoulding the polymer film and the metal element.

In an embodiment, the step of forming the metal element comprises the following sub-steps of:
depositing a metal seed layer in the second cavity and onto the external face of the mould;
forming a mask over the metal seed layer, the mask comprising a recess which exposes said region of the mould comprising the second cavity;
filling the second cavity of the mould and the recess of the mask with a metal electrolytically grown from the seed layer; and
removing the mask and etching the metal seed layer.

The step of providing the mould may comprise the following sub-steps of:
providing a stack successively comprising a support layer, a dielectric layer and a thin layer;
forming the first cavities by etching the thin layer to the dielectric layer and then etching the dielectric layer selectively with respect to the thin layer and the support layer; and
forming the second cavity by etching at least the thin layer and the dielectric layer.

Alternatively, the step of providing the mould may comprise the following sub-steps of:
providing a stack successively comprising a support layer, a dielectric layer and a thin layer;
forming the first cavities by anisotropically etching the thin layer to the dielectric layer, and then overetching the thin layer; and
forming the second cavity by etching at least the thin layer to the dielectric layer.

BRIEF DESCRIPTION OF THE FIGURES

Further characteristics and benefits of the invention will become clearer from the description thereof given below, by way of indicating and in no way limiting purposes, with reference to the following figures:

FIG. 4 schematically represents a third embodiment of the interconnexion film;

FIG. 5 schematically represents an embodiment of an electronic structure according to the second aspect of the invention, the electronic structure comprising a substrate, an electronic component and the interconnexion film disposed between the substrate and the electronic component;

FIG. 6 schematically represents the contact between a metal element of the interconnexion film and a conductive pad of the substrate;

For greater clarity, identical or similar elements are marked by identical reference signs throughout the figures.

DETAILED DESCRIPTION

Figure 1:
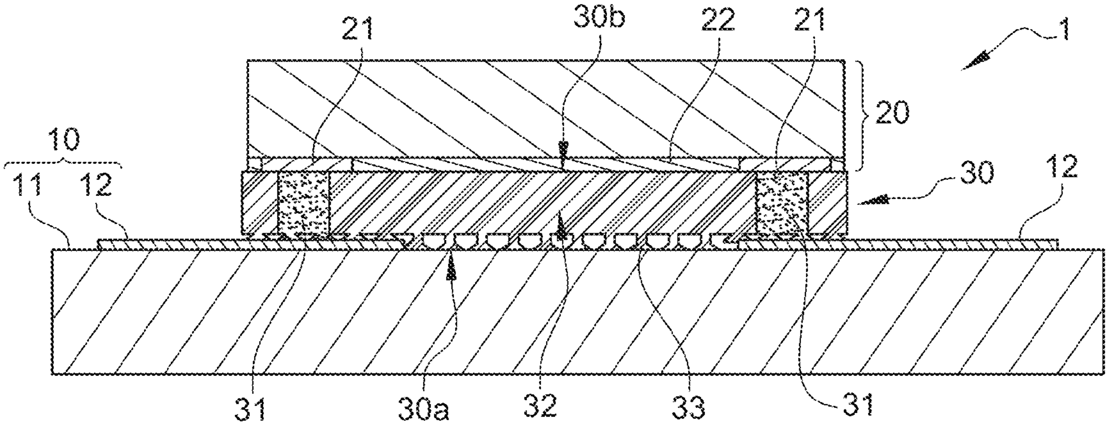
FIG. 1, previously described, represents an electronic structure comprising an interconnexion film according to prior art.
Figure 2:
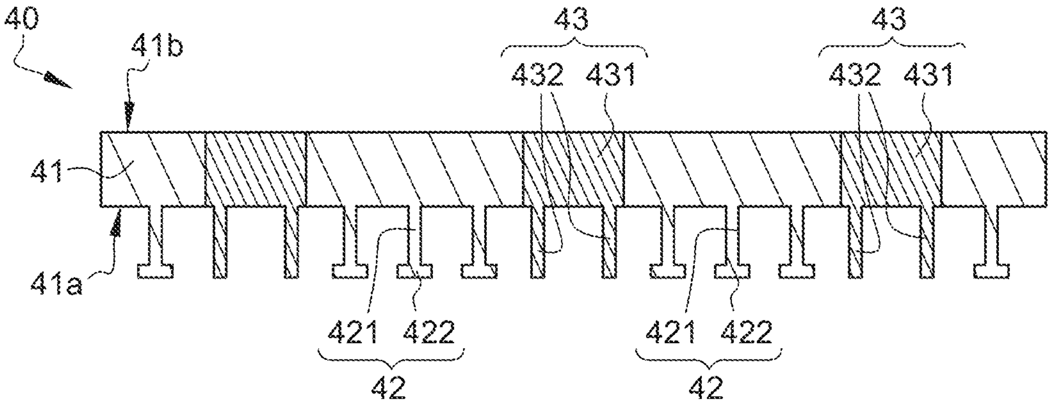
FIG. 2 schematically represents a first embodiment of the interconnexion film according to the first aspect of the invention.
Figure 3:
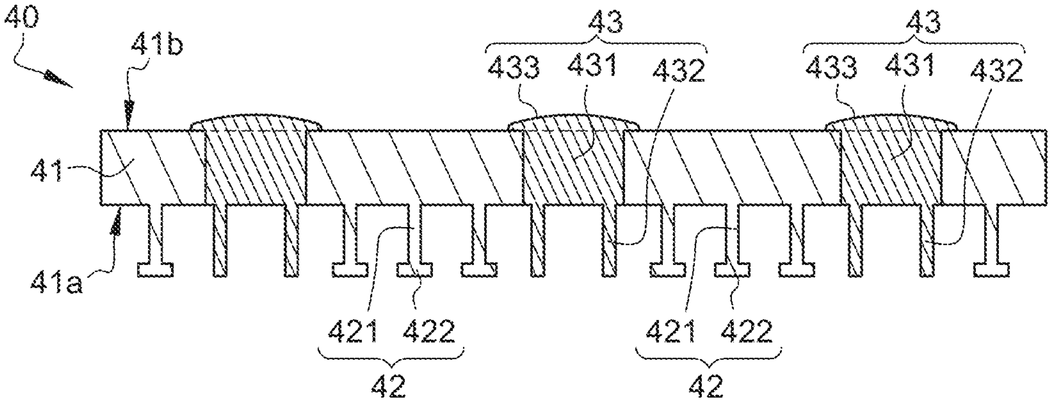
FIG. 3 schematically represents a second embodiment of the interconnexion film.

FIGS. 2 to 4 represent schematic cross-section views of different embodiments of an interconnexion film 40. This interconnexion film 40 can especially serve to mechanically and electrically connect an electronic component to a substrate, as described hereinafter in connection with FIG. 5.

In a manner common to all these embodiments, the interconnexion film 40 comprises:

- a base layer 41 formed of an electrically insulating polymeric material, the base layer 41 comprising a first face 41*a* and a second face 41*b* opposite to the first face 41*a;*
- first patterns 42 projecting from the first face 41*a*, the first patterns 42 being formed of the same polymeric material as the base layer 41; and
- at least one metal element 43 comprising:
  - a body 431 which extends through the base layer 41, from the first face 41*a* to the second face 41*b*; and
  - as an extension of the body 431, at least one second pattern 432 projecting from the first face 41*a*.

The first and second faces 41*a*-41*b* of the base layer 41 are beneficially planar and parallel to each other. The thickness of the base layer 41 (in other words the distance between the first and second faces 41*a*-41*b*) is for example between 10 μm and 250 μm, such as between 50 μm and 200 μm.

The electrically insulating polymeric material allows the interconnexion film 40 to stretch, compress and/or twist. The interconnexion film 40 is therefore a flexible and/or stretchable film. A film, layer or substrate is described here as "flexible" when it can undergo, without breaking, bending with a radius of curvature less than or equal to 1000 mm. It is meant by "stretchable film" a film that can stretch under mechanical load by more than 5%. In an embodiment, the polymeric material represents more than 50% of the total volume of the interconnexion film 40. The remaining volume of the interconnexion film 40 beneficially consists of the metal elements 43.

The polymeric material of the interconnexion film 40 is, in an embodiment, an elastomer. The elastomer material may be a silicone elastomer such as polydimethylsiloxane (PDMS), polyurethane, polyurethane-acrylate, polyvinylsiloxane, polypropylene, polylactic-co-glycolic acid (PLGA) or silicone polyaddition (also known as "platinum silicone").

The first patterns 42 have a shape and dimensions such that the interconnexion film 40 constitutes a dry adhesive film. The dry adhesive, inspired by the gecko legs and whose adhesive power is based on Van der Waals forces, is obtained by virtue of a micro-structuring on the surface of a material (typically a polymeric material). This type of film will be referred to as a "gecko tape". Thus, the interconnexion film 40 has all or some of the properties of a dry adhesive. The properties of a dry adhesive are directional (or anisotropic) adhesion, proper fastening with minimal mechanical preload, easy release, self-cleaning (absence of residues left on the surface) and high reusability.

Dry adhesives are good adhesives mainly in the case of perpendicular ("pull-off") or lateral (shear) stress, but less good in the case of peeling with a high peel angle. These adhesives are also breathable and often washable (which is beneficial when used directly on the skin).

The interconnexion film 40 can also be seen as having two opposite faces, one of its faces being structured to form a dry adhesive film.

The first patterns 42, in an embodiment, have identical shape and dimensions (within manufacturing tolerances).

In the embodiments represented by FIGS. 2 to 4, the first patterns 42 are mushroom-shaped. They are then similar to the spatulae present at the end of the gecko's setae. Each first pattern 42 comprises a pillar 421 (forming the stem of the mushroom) and a cap 422. The pillar 421 extends from the first face 41*a*, such as perpendicularly to the first face 41*a*. It thus comprises a first end integral with the base layer 41. The cap 422 is located at a second opposite end (i.e. remote from the first face 41*a*) of the pillar 421 and has, in a plane parallel to the first face 41*a*, dimensions greater than those of the pillar 421.

The pillar 421 of the first patterns 42 has, in a plane parallel to the first face 41*a*, a cross-section which is beneficially constant over the entire height of the pillar (cylindrical pillars, represented in FIGS. 2 to 4) or decreasing away from the first face 41*a* (frustoconical pillars). This cross-section is, for example, round, rectangular (especially square) or hexagonal.

The dimensions of the cross-section of the pillar 421 (measured in an orthonormal reference frame) are beneficially between 5 μm and 100 μm. The height of the pillar 421 (measured perpendicularly to the first face 41*a*) may be between 5 μm and 30 μm.

The cap 422 of the first patterns 42 has (in a plane parallel to the first face 41*a*) a cross-section whose dimensions are greater than those of the pillar 421. This cross-section, for example round or oval, may be constant over the entire height of the cap or increase away from the second end of the pillar 421, as represented in FIG. 4. The maximum dimensions of the cap 422 at its top part (i.e. at the end furthest from the first face 41*a*) are, in an embodiment, equal to the dimensions of the pillar 421 plus a value $\delta$ of between 1 μm and 6 μm. Thus, for example, $d2=d1+\delta$ in the case of a pillar 421 with a round cross-section (diameter d1) and a cap 422 with a round cross-section (diameter d2) or $x2=x1+\delta$ and $y2=y1+\delta$ in the case of a pillar 4211 with a rectangular cross-section (dimensions x1, y1) and a cap 422 with an oval cross-section (dimensions x2, y2). The height of the cap 422 is, in an embodiment, between 1 μm and 5 μm.

In one alternative embodiment not represented by the figures, the first patterns 42 are pillars of constant cross-section over their entire height (cylindrical pillars) or of increasing cross-section away from the first face 41*a* (frustoconical pillars). The cross-section of the pillars is, for example, round, rectangular (especially square) or hexagonal. The pillars, in an embodiment, extend perpendicularly to the first face 41*a*.

As described previously, the interconnexion film 40 comprises one or more metal elements 43 passing through the base layer 41. By way of example, FIGS. 2 to 4 show three metal elements 43, each metal element 43 comprising a body 431 and a plurality of (here two) second patterns 432.

Each metal element 43 may be intended to make an electrical connection between two objects disposed on either side of the interconnexion film 40. The metal elements 43 may have different shapes and dimensions (depending on the objects to be connected). The number N of second patterns 432 per metal element may also vary between the metal elements 43 (N is a natural number greater than or equal to 1).

In the remainder of the description, the example of an interconnexion film 40 comprising a plurality of metal elements 43 each with a plurality of second patterns 432 will be taken. However, this description remains valid in the case of a single metal element 43 (comprising one or more second patterns 432) and in the case of metal elements each comprising a single second pattern 432.

The metal elements 43 are made of solid metal, i.e. they are made of one or more metals and free of interstices (unlike a metal element made of agglomerated metal particles, for example). The metal elements 43 are, for example, made of copper, nickel, gold, silver, aluminium or an alloy of these metals.

The metal elements 43 thus have a high electrical conductivity, much higher than that of a metal element comprising conductive particles mixed with a polymeric material.

The body 431 of the metal elements 43 is embedded with the electrically insulating polymeric material of the base layer 41. The polymeric material thus forms one or more electrically insulating zones separating the metal elements 43, also known as metal inserts.

The body 431 has, in a plane parallel to the first face 41*a*, a cross-section which is beneficially constant over its entire height (equal to the thickness of the base layer 41). This cross-section is, for example, round, rectangular (especially square) or hexagonal. The dimensions of the cross-section of body 431 (measured in an orthonormal reference frame) are beneficially between 2 μm and 50 μm.

The second metal patterns 432 have a different shape (and function) from that of the first polymer patterns 42. Their role is to come into contact with the object located on the side of the first face 41*a* of the base layer 41, in order to make an electrical connection. They do not participate (or almost not) in the dry adhesion of the interconnexion film 40, unlike the first patterns 42.

The second patterns 432, in an embodiment, have identical shape and dimensions (within manufacturing tolerances).

The second patterns 432 have, in a plane parallel to the first face 41*a*, a constant or decreasing cross-section away from the first face 41*a*. This geometry allows the second patterns 432 to be easily unmoulded, without damage, despite their high rigidity (due to the fact that they are made of solid metal).

The cross-section of the second patterns 432 is, for example, round, rectangular (especially square) or hexagonal. Its dimensions (measured in an orthonormal reference frame) are beneficially between 5 μm and 100 μm, such as between 5 μm and 15 μm. The height of the second patterns 432 may be greater than or equal to the height of the first patterns 42.

In the embodiments of FIGS. 3 and 4, each metal element 43 comprises, in addition to the body 431 and the second patterns 432, a head 433 as an extension of the body 431. This head 433, or collar, partly rests on the second face 41*b* of the base layer 41. It provides better electrical contact with the object to be connected, located on the side of the second face 41*b*. Furthermore, it improves retention of the metal element 43 in the base layer 41, in particular during the unmoulding step of the manufacturing method described subsequently.

In the plane of the second face 41*b*, the head 433 has larger dimensions than the body 431. The maximum dimensions of the head 433, at the second face 41*b*, are, in an embodiment, equal to the dimensions of the body 431 plus a value δ' of between 1 μm and 10 μm. Its planar internal face rests on the base layer 41. Its external face may be planar or rounded.

Conversely, in the embodiment of FIG. 2, each metal element 43 is free of head and therefore only comprises the body 431 and the second patterns 432.

The first patterns 42 made of polymeric material can be evenly distributed over the first face 41*a* of the base layer 41, in order to achieve homogeneous adhesion of the interconnexion film 40. They then have a first pitch in a first direction and a second pitch in a second direction different from the first direction. The second pitch may be equal to the first pitch.

All of the first patterns 42 present on the first face 41*a* thus form a array. The array of first patterns 42 may especially have a rectangular mesh (perpendicular directions D1-D2), a square mesh (perpendicular directions D1-D2 and equal pitches P1-P2) or a parallelogram shape (angle between the directions D1-D2 between 0° and 90° excluded). The array of first patterns 42 beneficially occupies more than 50%, and for example more than 90%, of the surface area of the first face 41*a*.

The second patterns 432 of the metal elements 43 can be integrated into the array of first patterns 42 (respecting the first and second pitches). They then take the place of some of the first patterns 42.

FIG. 5 illustrates an example of use of the interconnexion film 40. This figure schematically represents an electronic structure 2 comprising a substrate 10, an electronic component 20 and the interconnexion film 40 disposed between the substrate 10 and the electronic component 20. In the absence of mechanical stresses, the substrate 10, the electronic component 20 and the interconnexion film 40 extend in parallel planes.

Beneficially, the substrate 10 is flexible (radius of curvature less than or equal to 1000 mm). In an embodiment, the substrate 10 can be flexed without breaking with a radius of curvature of less than or equal to 200 mm such as less than or equal to 50 mm. A flexible substrate 10 gives flexibility to the electronic structure 2, enabling it to be positioned on a non-planar support or on a surface that deforms over time, such as a moving body. The electronic structure 2 thus finds many applications in the medical field as a patch worn by a person, for example on a wrist, arm or torso.

By way of example, the electronic structure 2 may form part of a system for measuring temperature, heart rate, blood pressure or oxygen level, an actimetry system (measurement and analysis of movements), a system for measuring skin secretion (e.g. sweat), an electrical or optical stimulation system, or a drug administration system (also known as a transdermal patch).

The electronic structure 2 itself can be described as flexible when it is capable of bending to a radius of curvature of 1000 mm or less (for example 200 mm or less, such as 50 mm or less) without damage.

The substrate 10, in an embodiment, comprises a support film 11 and at least one electrically conductive so-called interconnexion pad 12 disposed on the support film 11 or ending on the surface of the support film 11. It may also comprise an electrical interconnexion network connected to the interconnexion pad 12 (this network comprising, for example, buried conductive tracks and vias connecting the conductive tracks together). The substrate 10 may be a printed circuit board (or PCB), a flexible substrate, a screen or another electronic component.

In the following description, it will be considered that the substrate 10 comprises a plurality of interconnexion pads 12.

For the sake of simplicity, only two interconnexion pads 12 have been represented in the cross-sectional plane of FIG. 5 (this cross-sectional plane being perpendicular to the planes of the substrate 10, the electronic component 20 and the interconnexion film 40).

The support film 11 beneficially consists of a flexible material, i.e. a material having a Young's modulus less than or equal to 10 GPa, for example less than or equal to 5 GPa. The support film 11 is, in an embodiment, made of a polymeric material, for example a polyester such as polyethylene naphthalate (or PEN) or polyethylene terephthalate (PET), a polyimide (PI), polytetrafluoroethylene (PTFE), polyetheretherketone (PEEK), polycarbonate (PC) or polyether sulphone (PES).

Alternatively, the support film 11 is made of a rigid material (>50 GPa), for example glass, ceramic, silicon or metal. However, the thickness of the support film 11 may be such as to enable the substrate 10 to meet the above-mentioned bending condition without breaking.

The thickness of the support film 11 is, in an embodiment, between 50 μm and 250 μm when it is made of a flexible material (e.g. polymeric material) and less than 1 mm when it is made of a rigid material such as glass or silicon.

The interconnexion pads 12 may be of metal, for example copper (Cu), silver (Ag), gold (Au), aluminium (Al), tungsten (W), nickel (Ni), platinum (Pt), titanium (Ti) or ruthenium (Ru). They can also be made of indium tin oxide (ITO) or a conductive polymer such as poly(3,4-ethylenedioxythiophene) known as PEDOT. They can be produced by depositing and etching one or more layers of metal, by screen printing using a paste or ink loaded with metal particles or by additive methods (material jetting, 3D printing). Each interconnexion pad 12 may consist of a single layer or of a stack of several layers having different functions (e.g. adhesion layer, diffusion barrier layer and inert finish layer). The thickness of the interconnexion pads 12 may be between 50 nm and 5 μm, such as between 100 nm and 2 μm.

The electronic component 20 may be an integrated circuit (for example an application-specific integrated circuit or ASIC), a sensor (temperature, heart rate, etc.), an actuator, a stimulator, a microbattery or an RFID chip. Its thickness is beneficially less than or equal to 1 mm, such as less than or equal to 100 μm, in order to maximise flexibility properties of the electronic structure 2.

The electronic component 20 comprises at least one connection pad 21 ending on a so-called active face of the component (in other words, part of the active face is formed by the connection pad 21). The connection pad 21 is, in an embodiment, embedded in a dielectric layer 22. It beneficially forms a planar surface with the dielectric layer 22. The dielectric layer 22, also known as the passivation layer, consists of an electrically insulating material.

As illustrated in FIG. 5, the electronic component 20 may comprise a plurality of distinct connection pads 21 contained in the dielectric layer 22. The connection pads 21 typically constitute the input and output terminals of the electronic component 20.

The connection pads 21 are, in an embodiment, made of metal, for example copper (Cu), silver (Ag), gold (Au), aluminium (Al), an aluminium alloy of the AlSi or AlCu type, tungsten (W), nickel (Ni), platinum (Pt), titanium (Ti) or ruthenium (Ru).

The active face of the electronic component 20 is facing towards the substrate 10. Thus, the electronic component 20 is interconnected to the substrate 10 according to a flip-chip interconnexion technique.

At least one metal element 43 of the interconnexion film 40, called an electrical interconnexion element, provides electrical connection between the electronic component 20 and the substrate 10. This metal element 43 can be arranged to electrically connect an interconnexion pad 12 of the substrate 10 to a connection pad 21 of the electronic component 20.

In an embodiment, the interconnexion film 40 comprises several electrical interconnexion elements.

The second patterns 432 improve resistance of the electrical interconnexion elements to mechanical stresses, in particular tensile, shear and/or bending stresses.

One or more metal elements 43 of the interconnexion film 40 may not serve as electrical interconnexion elements between the substrate 10 and the electronic component 20.

In the configuration of FIG. 5, the first face 41*a* of the base layer 41 is disposed facing the substrate 10 and the second face 41*b* of the base layer 41 is disposed facing the electronic component 20. The first patterns 42 and the second patterns 432 are therefore in contact with the substrate 10.

The second face 41*b* of the base layer 41 is beneficially bonded to the electronic component 20. In other words, a layer of adhesive 50 separates the electronic component 20 and the second face 41*b* of the base layer 41.

In another configuration not represented by the figures, the first face 41*a* of the base layer 41 is disposed facing the electronic component 20, and the second face 41*b* of the base layer 41 is disposed facing the substrate 10. The first patterns 42 and the second patterns 432 are therefore in contact with the electronic component 20. The second face 41*b* of the base layer 41 can be bonded to the substrate 10.

In order for the interconnexion film 40 to adhere to the substrate 10 (respectively to the electronic component 20) by means of the first patterns 42 (dry adhesion), pressure is applied to the second face 41*b* of the base layer 41, for example via the electronic component 20 (respectively the substrate 10). In doing so, the first polymer patterns 42 are temporarily (elastically) deformed.

The fact that the second patterns 432 have a height greater than or equal to that of the first patterns 42 ensures electrical contact even after the first patterns 42 have returned to their initial shape. The compression of the first patterns 42, and therefore the difference in height between the first patterns 42 and the second patterns 432, can be between 1 μm and 2 μm.

FIG. 6 shows that the second patterns 432 of the metal elements 43 can flex or deform on contact with the substrate 10, especially when they have a greater height than the first patterns 42, even after the pressure has been released.

By virtue of the interconnexion film 40 mainly consisting of the polymeric material, the electronic structure 2 has excellent resistance to mechanical stresses, in particular to tensile (stretching), bending and shearing stresses.

Further to applications in the medical field, the interconnexion film 40 can be used to functionalise a surface, such as a screen or a dashboard. It may also facilitate disassembly of an electronic component or serve to test an electronic component on an electronic board.

FIGS. 7A to 7K represent steps S1 to S10 of a method for manufacturing the interconnexion film 40 described above.

Steps 7A to 7D relate to the provision of a mould 70 comprising first cavities 71 intended for the formation of first patterns 42 and at least one second cavity 72 intended for the formation of a second pattern 432. Thus, the first cavities 71 have the shape and dimensions of the first patterns 42, and the second cavity 72 has the shape and dimensions of a second pattern 432. The first cavities 71 and the second cavity 72 extend from an external face (or upper face) 70*a* of the mould 70, for example perpendicularly to the plane of this external face 70*a*.

The manufacturing method will be described hereinafter taking the example of a mould 70 comprising a plurality of second cavities 72 to form a plurality of second patterns 432 belonging to a plurality of metal elements 43.

Figure 7A:
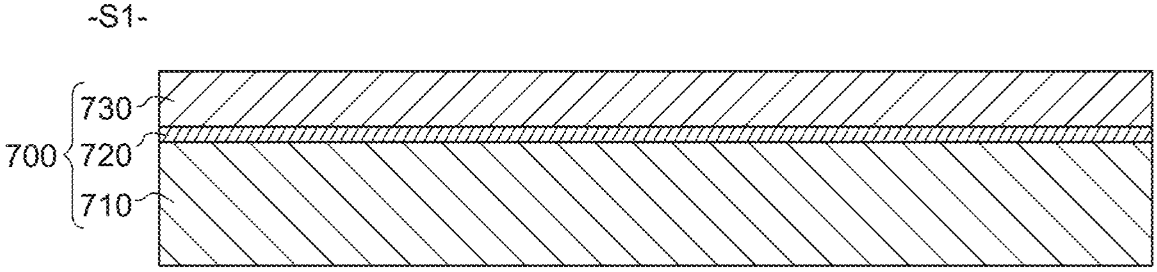
FIGS. 7A to 7K represent steps of a method for manufacturing an interconnexion film according to the third aspect of the invention.

The mould 70 can be manufactured from a stack 700, provided in step S1 of FIG. 7A. The stack 700 successively comprises a support layer 710, a dielectric layer 720 and a thin layer 730. The surface of the thin layer 730 constitutes the external face (or upper face) 70*a* of the mould 70.

The support layer 710 is, in an embodiment, made of a semiconductor material, for example silicon.

The dielectric layer 720 is, in an embodiment, a so-called buried oxide layer (or BOX layer), for example of silicon dioxide ($SiO_2$). Its thickness is, in an embodiment, between 1 μm and 5 μm.

The thin layer 730 (also called the active layer, device layer or upper layer) is, in an embodiment, made of a semiconductor material, for example single crystal silicon. Its thickness is, in an embodiment, less than or equal to 30 μm, such as between 5 μm and 30 μm.

The stack 700 can especially be a multilayer structure of the silicon-on-insulator (SOI) type, commonly called an SOI substrate.

Figure 7B:
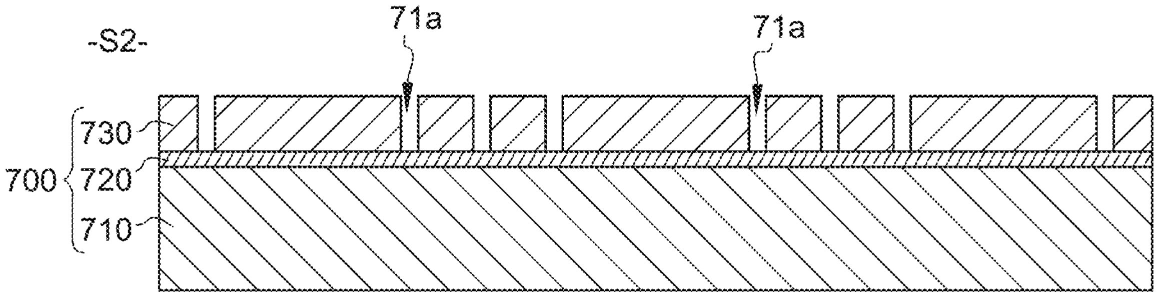

In step S2 of FIG. 7B, a first portion 71*a* of the first cavities 71 is formed by etching the thin layer 730 to the dielectric layer 720. Etching is performed through a first etch mask (not represented), for example made of photosensitive resin, previously formed on the thin layer 730. The thin layer 730 is, in an embodiment, etched anisotropically, for example by Deep Reactive Ion Etching (DRIE) or by Reactive Ion Etching using an Inductively Coupled Plasma (RIE-ICP). The dielectric layer 720 serves as an etch stop layer.

Figure 7C:
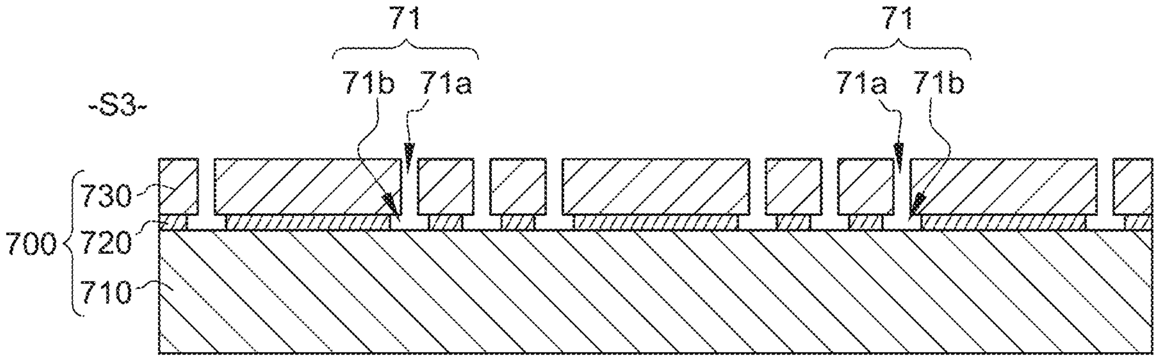

Then, in step S3 of FIG. 7C, a second portion 71*b* of the first cavities 71 is formed by etching the dielectric layer 720 selectively with respect to the support layer 710 and the thin layer 730. This etching is, in an embodiment, an isotropic etching, for example a wet etching in a bath or vapour of hydrofluoric acid (HF) in the case of a dielectric layer 720 made of $SiO_2$.

The first portion 71*a* of the first cavities 71 located in the thin layer 730 is intended to form the pillar 421 of the first patterns 42, while the second portion 71*b* of the first cavities 71 located in the dielectric layer 720 is intended to form the cap 422 of the first patterns 42.

The first etch mask can be removed after etching step S2 of FIG. 7B or after etching step S3 of FIG. 7C.

Figure 7D:
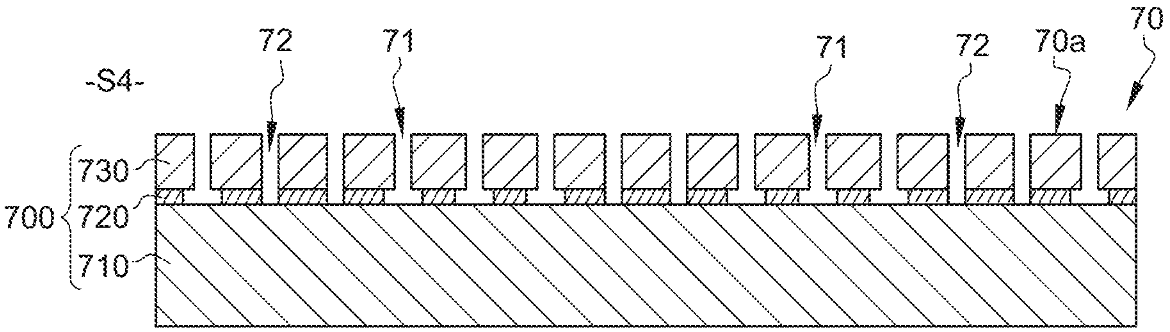
Figure 7E:
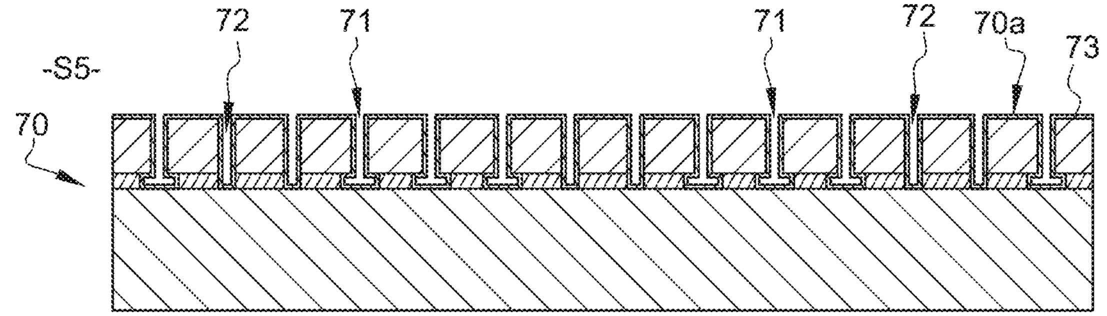
Figure 7F:
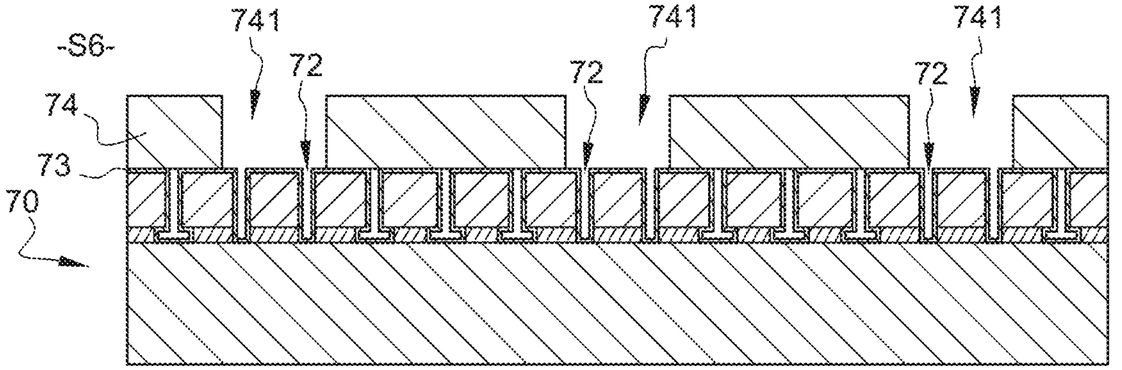

FIG. 7D represents a step S4 of forming the second cavities 72 of the mould 70, here by etching at least the thin layer 730 and the dielectric layer 720. This etching is carried out through a second etch mask (not represented), previously formed on the thin layer 730. The second etch mask, in an embodiment, consists of a dry film photosensitive resin, to avoid filling the first cavities 71 of the mould 70.

In a first embodiment, step S4 of forming the second cavities 72 comprises two successive etching operations (through the second etch mask):

- anisotropically etching (e.g. by DRIE or RIE-ICP) the thin layer 730, with stopping on the dielectric layer 720; and
- anisotropically etching (e.g. by RIE) the dielectric layer 720 with stopping on the support layer 710.

The second cavities 72 then have a depth equal to that of the first cavities 71 (and equal to the sum of the thicknesses of the thin layer 730 and the dielectric layer 720).

In a second embodiment, step S4 of forming the second cavities 72 comprises three successive etching operations (through the second etch mask):

- anisotropically etching (e.g. by DRIE or RIE-ICP) the thin layer 730, with stopping on the dielectric layer 720;
- anisotropically etching (e.g. by RIE) the dielectric layer 720 with stopping on the support layer 710; and
- anisotropically etching a surface part of the support layer 710 (typically to a depth of between 1 μm and 2 μm).

The second etch mask is removed after step S4 of forming the second cavities 72.

Step S4 of forming the second cavities 72 (see FIG. 7D) may be performed before steps S2 and S3 of forming the first cavities 71 (see FIGS. 7B-7C).

Steps S5 to S8 represented by FIGS. 7E to 7H relate to the formation of the metal elements 43 of the interconnexion film 40.

In S5 (see FIG. 7E), a metal seed layer 73 is deposited in the first cavities 71, in the second cavities 72 and onto the external face 70*a* of the mould 70. The metal seed layer 73 is deposited using a conformal deposition technique, such as chemical vapour deposition (CVD). It thus covers the walls of the first and second cavities 71-72, without filling them completely, and the external face 70*a* of the mould. The metal seed layer 73 consists, for example, of a titanium-copper alloy (TiCu), an alloy of titanium, titanium nitride and copper (TiTiNCu), an alloy of titanium, nickel and gold (TiNiAu) or an alloy of titanium, titanium nitride and gold (TiTiNAu).

Then, in S6 (see FIG. 7F), a mask 74 is formed on the metal seed layer 73. The mask 74 comprises recesses 741, each recess 741 exposing a region of the mould 70 dedicated to the formation of a metal element 43 of the interconnexion film 40. Each region of the mould 70 dedicated to the formation of a metal element 43 comprises one or more second cavities 72 (of the plurality of second cavities 72 of the mould). The mask 74 is, in an embodiment, made of a dry film photosensitive resin, to avoid filling the first and second cavities 71-72 of the mould 70 (during its formation).

Figure 7G:
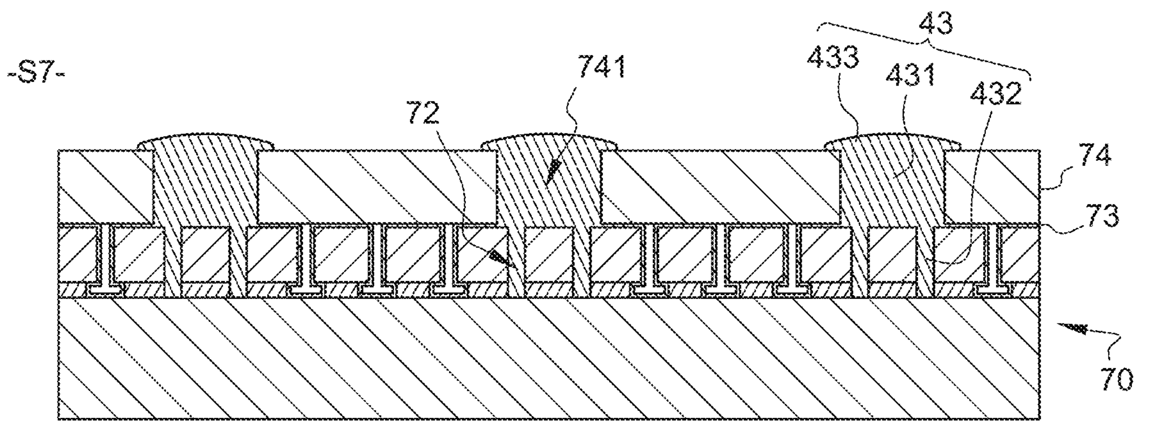
Figure 7H:
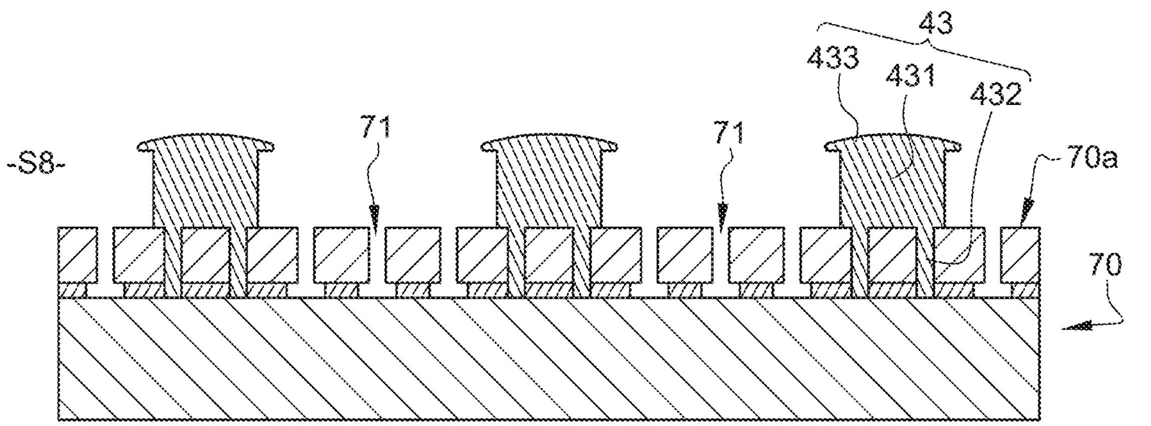

In a step S7 represented by FIG. 7G, the second cavities 72 of the mould 70 and the recesses 741 of the mask 74 are filled with a metal by electrolytic growth from the seed layer 73. This forms the second patterns 432 of the metal elements 43 inside the second cavities 72 and the body 431 of the metal elements 43 in the recesses 741 of the mask 74, on the external surface 70*a* of the mould 70. Growth may continue after the recesses 741 have been completely filled so as to form the heads 433 of the metal elements 43 (the metal protruding on the mask 74).

At S8 (see FIG. 7H), the mask 74 is removed and the metal seed layer 73 is etched (outside regions occupied by the metal elements 43).

Figure 7I:
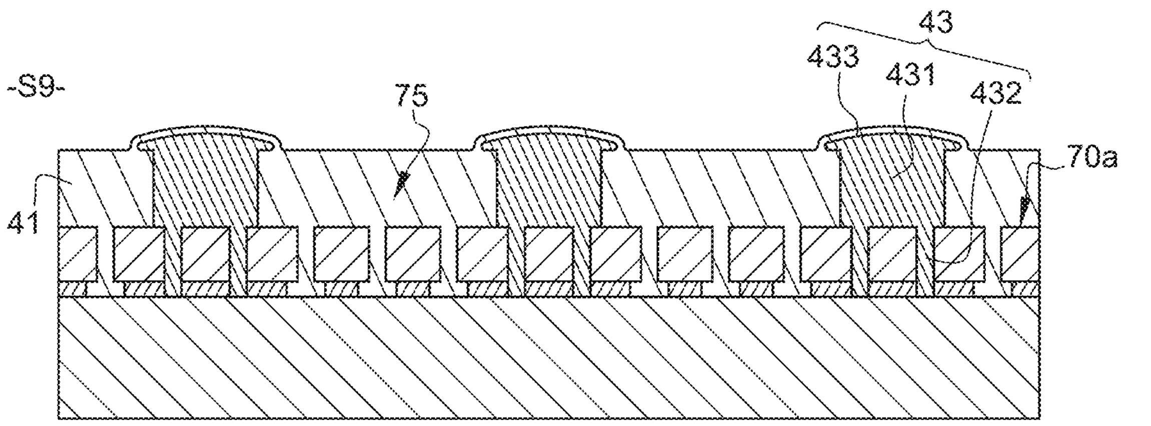
Figure 7J:
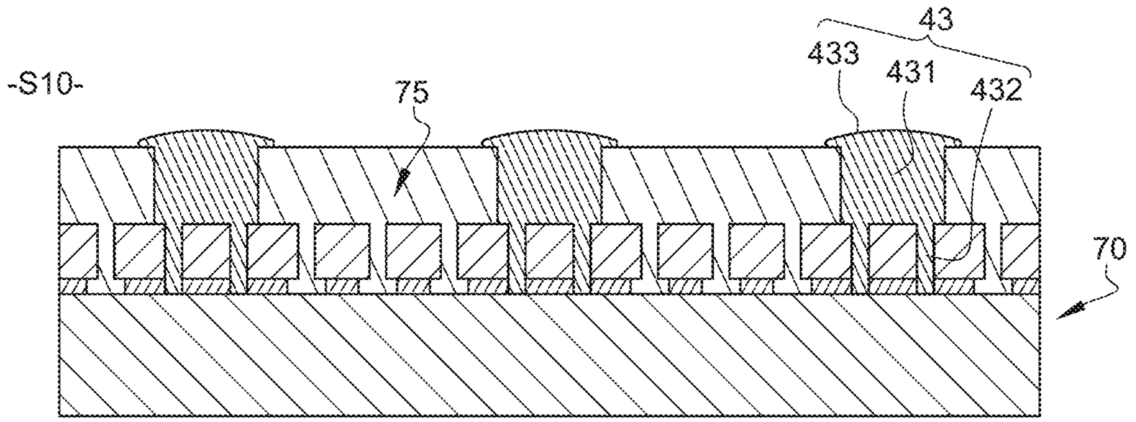

In step S9 of FIG. 7I, an electrically insulating polymeric material 75 is deposited in the first cavities 71 and onto the external face 70*a* of the mould 70, so as to form a polymer film which fills the first cavities 71 and embeds the body 431 of the metal elements 43. The polymeric material, initially in liquid form, is deposited (poured) on the mould 70, in the first cavities 71 and around the metal elements 43, and then cured or cross-linked (under conditions specific to each polymeric material).

The polymeric material 75 may be deposited in excess and completely cover the metal elements 43. The upper face of the metal elements 43 is then exposed in a step S10 represented by FIG. 7J, for example by chemical-mechanical polishing or etching of the polymer (for example by RIE).

Figure 7K:
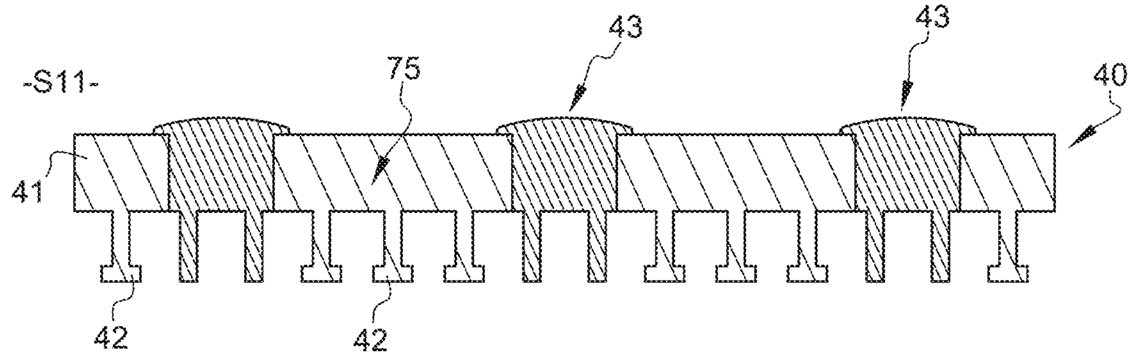

Finally, in step S11 of FIG. 7K, the polymer film and the metal elements 43 trapped in the polymer film are extracted from the mould 70. The assembly obtained at the end of this unmoulding step S11 constitutes the interconnexion film 40. The polymer film forms the base layer 41 and the first patterns 42 of the interconnexion film 40. The first patterns 42 are easy to be unmoulded because they are made of polymeric material. The second patterns 432 of the metal elements 43 are just as easy to be unmoulded despite their rigidity, by virtue of their particular geometry (different from that of the first patterns 42).

In order to obtain an interconnexion film 40 whose two faces are structured, two films as represented in FIG. 7K can be manufactured and then coupled together (at their unstructured face), for example by plasma-type surface activation followed by pressure assembling.

Figure 8:
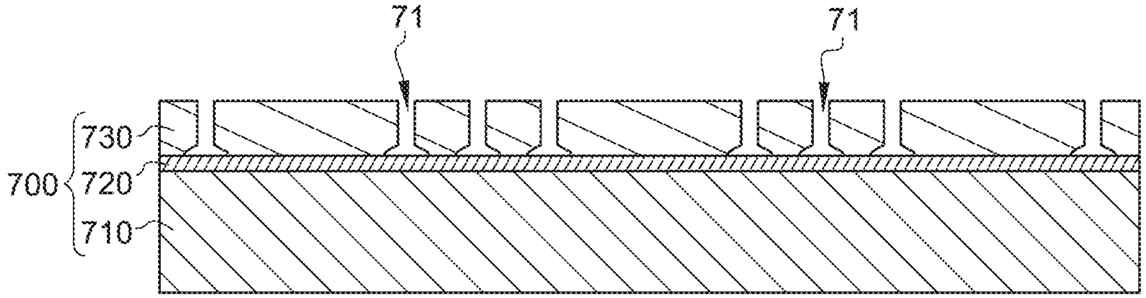
FIG. 8 represents a step of the manufacturing method which may replace the steps of FIGS. 7B and 7C.

FIG. 8 represents one alternative embodiment of the step of forming the first cavities 71 of mould 70. Rather than successively etching the thin layer 730 (step S2) and the dielectric layer 720 (step S3), the first cavities 71 are obtained by etching only the thin layer 730, first in an anisotropic manner (e.g. DRIE or RIE-ICP) with stopping on the dielectric layer 720, then by over-etching the thin layer 730 (i.e. selective etching is continued so as to etch the thin layer 730 laterally, along the dielectric layer 720). This produces the first cavities 71 with a flared shape, making it possible to obtain the first patterns 42 of FIG. 4. The lateral dimensions of this flare (and therefore of the cap 422) depend on the overetching time (counted from the moment when the etching reaches the dielectric layer 720). For example, the diameter of the overetched zone at the interface with the dielectric layer 720 may be 15 μm for a starting cavity 10 μm in diameter (in the upper part of the thin layer 730).

The second cavities 72 can then be obtained either by etching (anisotropically) only the thin layer 730 up to the dielectric layer 720 (same depth as the first cavities 71), or by successively etching the thin layer 730 and the dielectric layer 720 (second cavities 72 deeper than the first cavities 71), as described previously in connection with FIG. 7D (first embodiment).

Numerous alternatives and modifications of the interconnexion film, its manufacturing method and the electronic structure will become apparent to the person skilled in the art. In particular, the substrate 10 of the electronic structure 2 may not be flexible. In this case, the interconnexion film 40 is beneficial for absorbing mechanical stresses due to the different coefficients of thermal expansion between the substrate 10 and the electronic component 20.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

It will be appreciated that the various embodiments and aspects of the inventions described previously are combinable according to any technically permissible combinations. For example, various aspects of the present disclosure may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The present invention has been described and illustrated in the present detailed description and in the figures of the appended drawings, in possible embodiments. The present invention is not however limited to the embodiments described. Other alternatives and embodiments may be deduced and implemented by those skilled in the art on reading the present description and the appended drawings.

In the claims, the term "includes" or "comprises" does not exclude other elements or other steps. The different characteristics described and/or claimed may be beneficially combined. Their presence in the description or in the different dependent claims do not exclude this possibility. The reference signs cannot be understood as limiting the scope of the invention.

The invention claimed is:

1. An interconnexion film comprising:
- a base layer formed of an electrically insulating polymeric material and comprising a first face and a second face opposite to the first face;
- a plurality of first patterns projecting from the first face, the first patterns being formed of the electrically insulating polymeric material and configured so that the interconnexion film constitutes a dry adhesive film;
- a metal element comprising:
  - a body which extends through the base layer from the first face to the second face; and
  - as an extension of the body, at least one second pattern projecting from the first face;
- wherein the metal element is made of solid metal and wherein said at least one second pattern of the metal element has a shape different from that of the first patterns and, in a plane parallel to the first face, a constant or decreasing cross-section away from the first face.

2. The interconnexion film according to claim 1, wherein each first pattern comprises a pillar extending from the first face of the base layer and a cap located at one end of the pillar, the cap having, in a plane parallel to the first face, dimensions greater than those of the pillar.

3. The interconnexion film according to claim 1, wherein the metal element further comprises, as an extension of the body, a head which rests on the second face of the base layer.

4. The interconnexion film according to claim 1, wherein said at least one second pattern of the metal element has a height greater than or equal to that of the first patterns.

5. An electronic structure comprising:
- a substrate;
- an electronic component, and
- an interconnexion film according to claim 1, disposed between the substrate and the electronic component so as to electrically and mechanically connect the electronic component to the substrate.

6. The electronic structure according to claim 5, wherein:
- the substrate comprises an electrically conductive pad;
- the electronic component comprises a connection pad, and
- the metal element of the interconnexion film connects the electrically conductive pad to the connection pad.

7. The electronic structure according to claim 5, wherein:

the first face of the base layer is disposed facing the substrate;

the first patterns are in contact with the substrate, and the second face of the base layer is disposed facing the electronic component.

8. The electronic structure according to claim 7, wherein the second face of the base layer is separated from the electronic component by a layer of adhesive.

9. A method for manufacturing an interconnexion film that includes a base layer formed of an electrically insulating polymeric material and comprising a first face and a second face opposite to the first face; a plurality of first patterns projecting from the first face, the first patterns being formed of the electrically insulating polymeric material and configured so that the interconnexion film constitutes a dry adhesive film; a metal element comprising: a body which extends through the base layer from the first face to the second face; and as an extension of the body, at least one second pattern projecting from the first face; wherein the metal element is made of solid metal and wherein said at least one second pattern of the metal element has a shape different from that of the first patterns and, in a plane parallel to the first face, a constant or decreasing cross-section away from the first face, the method comprising:

providing a mould comprising first cavities and a second cavity, the first cavities and the second cavity extending from an external face of the mould, the second cavity having a shape different from that of the first cavities and, in a plane parallel to the external face, a constant or decreasing cross-section away from the external face;

forming the metal element in a region of the mould comprising the second cavity, the metal element comprising the body disposed on the external face of the mould and, as an extension of the body, a projecting pattern disposed inside the second cavity;

depositing the electrically insulating polymeric material in the first cavities and onto the external face of the mould, so as to form a polymer film which embeds the body of the metal element, and unmoulding the polymer film and the metal element.

10. The method according to claim 9, wherein the forming of the metal element comprises the following sub-steps of:

depositing a metal seed layer in the second cavity and onto the external face of the mould;

forming a mask on the metal seed layer, the mask comprising a recess which exposes said region of the mould comprising the second cavity;

filling the second cavity of the mould and the recess of the mask with a metal by electrolytic growth from the seed layer, and removing the mask and etching the metal seed layer.

11. The method according to claim 9, wherein providing the mould comprises the following sub-steps of:

providing a stack successively comprising a support layer, a dielectric layer and a thin layer;

forming the first cavities by etching the thin layer to the dielectric layer, then by etching the dielectric layer selectively with respect to the thin layer and the support layer, and forming the second cavity by etching at least the thin layer and the dielectric layer.

12. The method according to claim 9, wherein providing the mould comprises the following sub-steps of:

providing a stack successively comprising a support layer, a dielectric layer and a thin layer;

forming the first cavities by anisotropically etching the thin layer to the dielectric layer and then overetching the thin layer, and forming the second cavity by etching at least the thin layer to the dielectric layer.

* * * * *